United States Patent [19]
Czaja et al.

[11] Patent Number: 5,784,392
[45] Date of Patent: Jul. 21, 1998

[54] VITERBI DECODER WITH L=2 BEST DECODING PATHS

[75] Inventors: Stash Czaja, Cardiff; Ilkka J. Niva; Jim Robertson, both of San Diego, all of Calif.

[73] Assignee: Nokia Mobile Phones Ltd., Salo, Finland

[21] Appl. No.: 494,917

[22] Filed: Jun. 26, 1995

[51] Int. Cl.$^6$ .................................................. G06F 11/10
[52] U.S. Cl. ........................ 371/43.1; 371/43.5; 371/43.6
[58] Field of Search ........................... 371/43, 37.4, 37.7, 371/43.1, 37.02, 37.05, 37.07, 37.11, 37.12, 44–46, 43.3, 43.4, 43.5, 43.6, 43.7, 43.8; 375/265, 262, 341, 737, 11, 94, 96

[56] References Cited

U.S. PATENT DOCUMENTS

| | | | |
|---|---|---|---|
| 5,327,439 | 7/1994 | Estola et al. | 371/43 |
| 5,375,129 | 12/1994 | Cooper | 371/43 |
| 5,574,751 | 11/1996 | Trelewicz | 371/43 |
| 5,577,053 | 11/1996 | Dert | 371/43 |

FOREIGN PATENT DOCUMENTS 0 446 745  9/1991  European Pat. Off. .

OTHER PUBLICATIONS

M. Biver, "Architectural Design and Realization of a Single–Chip Viterbi Decoder", 8220 Integration, the VSLI Journal 8 (1989) Oct., No. 1, Amsterdam, NL, pp. 3–16.

G.D. Forney, "The Viterbi Algorithm", Proc. IEEE, vol. 61, May 1973.

J.H. Lodge et al., "Separable Map Filters for Decoding of Product and Concatenated Codes", Proc. IEEE ICC '93.

J. Hagenauer et al., "A Viterbi Algorithm with Soft–Decision Outputs and Its Application", Proc. IEEE Globecomm 1989.

N. Seshardi et al., "On Post Detection Symbol Reliability Generation", Proc. IEE ICC 1993, Geneva, May 1993.

T. Hashimoto, "A List–Type–Reduced–Constraint Generalization of the Viterbi Algorithm", IEEE Trans. Info. Theory, Nov. 1987.

(List continued on next page.)

*Primary Examiner*—Thomas O. Lee
*Assistant Examiner*—Thomas E. Brown
*Attorney, Agent, or Firm*—Perman & Green, LLP

[57] ABSTRACT

This invention teaches a method, and circuits that operate in accordance with the method, for decoding data received from a communications channel. The method includes the steps of: (a) receiving a modulated communications signal that conveys block encoded data having at least a data field and a syndrome data field; and (b) determining transition metrics and path metrics for the block encoded data. The step of determining path metrics includes a step of retaining path metrics only for a Maximum-Likelihood (ML) path and for a second best ML path. The method further includes a step of: (c) decoding the block encoded data by performing either a full or a partial traceback operation for both the ML path metrics and also for the second best ML path metrics. In a full traceback there is obtained from the ML path a first plurality of detected bits representing the data field, a second plurality of detected bits from the ML path representing the syndrome data field, a third plurality of detected bits from the second best ML path representing the data field, and a fourth plurality of detected bits from the second best ML path representing the syndrome data field. A next step (d) determines a syndrome from the first plurality of detected bits, and then compares the determined syndrome to the second plurality of detected bits. Upon a match a next step (e) outputs the first plurality of detected bits as a received frame of data. If the step of comparing the determined syndrome to the second plurality of detected bits does not indicate a match, the method instead: (f) determines a syndrome from the third plurality of detected bits; (g) compares the determined syndrome to the fourth plurality of detected bits and, upon a match, (h) outputs the third plurality of detected bits as a received frame of data.

14 Claims, 5 Drawing Sheets

OTHER PUBLICATIONS

"Adaptive Maximum-Likelihood Receiver for Carrier-Modulated Data-Transmission Systems", G. Ungerboeck, IEEE Trans. Comm., May 1974, pp. 624–636.

"New VLSI Architechtures for Fast Soft-Decision Threshold Decoders", P. Lavoie, IEEE Trans. Comm., vol. 39, No. 2, Feb. 1991.

"Viterbi Algorithms with List and Soft Symbols Output: Extensions and Comparisons", C. Nill et al., IEEE, 1993, pp. 788–792.

G. Battail, "Weighting the Symbols Decoded by the Viterbi Algorithm", IEEE Int. Symp. Info. Theory, Oct. 1986, p. 141.

VITERBI DECODER WITH L=2 BEST DECODING PATHS

FIELD OF THE INVENTION

This invention relates generally to telecommunications apparatus and methods and, in particular, to radiotelephones that employ a Viterbi decoding technique to decode received data.

BACKGROUND OF THE INVENTION

A direct-sequence or direct sequence coding spread spectrum communication technique in essence combines two digital signals, or bit streams, to create a third signal prior to transmission. The first signal is an information signal, such as the output of a digitized voice circuit. For example, the first signal may have a bit rate of 10 kb/s. The second signal is generated by a random-sequence, or pseudonoise (PN) generator, and is a stream of essentially random bits having a bit rate that is several orders of magnitude greater than the bit rate of the digitized voice signal. The modulation of these two signals results in the third signal having the same bit rate as the second signal. However, the third signal also contains the digitized voice signal. At the receiver, an identical random-sequence generator produces a random bit stream which mirrors the original random-sequence that was used for modulation at the transmitter. For proper operation, after carrier frequency demodulation, the PN generator of the receiver must be synchronized to the incoming PN sequence. By removing the random sequence from the received signal and integrating it over a symbol period, a despread signal is obtained. Ideally, the despread signal exactly represents the original 10 kb/s voice signal.

To guard against transmission errors due to multipath interference, inter-symbol interference (ISI), and channel impairments in general, it is well-known to encode a block of digital data (voice or signalling information) prior to transmission and to then decode the block after reception. For example, the use of convolutional codes and a cyclic redundancy code (CRC) is one suitable technique for error correction and protection.

As can be appreciated, when receiving a digitally encoded block of data it is often important to both quickly and accurately decode the block to determine if the block was received without errors. The Viterbi algorithm is one well-known technique for decoding a block of encoded data. One result of the operation of the Viterbi algorithm is the generation of a state transition diagram, referred to as a trellis. The decoder operates to generate a path, such as a maximum likely (ML) path, through the trellis. The ML path is then traced back to a starting node. The traceback operation results in the generation of a bit sequence that ideally corresponds to the transmitted bit sequence. If no errors are detected the ML path represents the originally transmitted data, without errors.

A List Output Viterbi Algorithm (LOVA) is based on an assumption that in order to find the global L best-decoded candidates, it is necessary to find and retain the L best candidates that lead into each state at every trellis transition. However, this requires an increase in the decoder memory by a factor of L, or requires that multiple decoding passes be performed on the input data. As can be realized, it may not be practical to provide a memory of the required size in a low cost radiotelephone terminal.

Furthermore, there may not be sufficient time to perform multiple decoding passes when operating the radiotelephone terminal at a high baud rate (e.g. 9600 baud).

In general, it has been found that to obtain even a 0.1 dB improvement in the operation of the Viterbi algorithm, a significant cost and complexity increment in required.

The use of the Viterbi algorithm for decoding digital data in a communication channel is described in the commonly-assigned U.S. Pat. No. 5,327,439, issued Jul. 5, 1994, (K. Estola et al.) and in European Patent Application 0446745A2 (18.09.91) by H. Jokinen et al. Reference can also be had to the following publications for describing various aspects of the use of the Viterbi algorithm: G. D. Forney, "The Viterbi Algorithm", Proc. IEEE, Vol. 61, May 1973; J. H. Lodge et al. "Separable MAP filters for Decoding of Product and Concatenated Codes", Proc. IEEE ICC '93; J. Hagenauer, et al., "A Viterbi Algorithm with Soft-Decision Outputs and Its Application", Proc. IEEE Globecomm 1989; N. Seshardi, et al. "On Post Detection Symbol Reliability Generation, Proc. IEE ICC 1993, Geneva, May 1993; and T. Hashimoto, "A List-Type-Reduced-Constraint Generalization of the Viterbi Algorithm", IEEE Trans. Info. Theory, November 1987.

Reference can also be had to U.S. Pat. No. 5,375,129, "Maximum Likelihood Sequence Detector", by A. Cooper for a description of a maximum likelihood detector that uses the Viterbi algorithm for estimating a sequence of data bits received over a communication channel.

OBJECTS OF THE INVENTION

It is an object of this invention to provide a method that implements a low power and efficient Viterbi decoder.

It is another object of this invention to provide a Viterbi decoder that operates with a Maximum Likely path and with a second best Likely path technique in either a full traceback or a partial traceback mode of operation.

SUMMARY OF THE INVENTION

The foregoing and other problems are overcome and the objects are realized by a method and a circuit arrangement in accordance with this invention. This invention teaches methods, and circuits that operate in accordance with the methods, for decoding data received from a communications channel.

For a full traceback embodiment of this invention, the method includes the steps of: (a) receiving a frame of a modulated communications signal that conveys block encoded data having at least a data field and a syndrome data field; and (b) determining transition metrics and path metrics for the block encoded data. In accordance with an aspect of this invention the step of determining path metrics includes a step of retaining path metrics only for a Maximum Likely (ML) path and for a second best Likely path.

The method further includes a step of: (c) decoding the block encoded data by performing a full traceback operation for both the ML path metrics and also for the second best path metrics. The full traceback operation obtains from the ML path a first plurality of detected bits representing the data field; a second plurality of detected bits from the ML path representing the syndrome data field; a third plurality of detected bits from the second best path representing the data field; and a fourth plurality of detected bits from the second best path representing the syndrome data field.

A next step (d) determines a syndrome from the first plurality of detected bits, and then compares the determined syndrome to the second plurality of detected bits. Upon a match a next step (e) outputs the first plurality of detected bits as a received frame of data.

If the step of comparing the determined syndrome to the second plurality of detected bits does not indicate a match, the method instead executes the steps of: (f) determining a syndrome from the third plurality of detected bits; (g) comparing the determined syndrome to the fourth plurality of detected bits and, upon a match, (h) outputting the third plurality of detected bits as a received frame of data.

For a partial traceback embodiment of this invention, the method includes the steps of: (a) receiving a frame of a modulated communications signal that conveys block encoded data having at least a data field and a syndrome data field; and (b) determining transition metrics and path metrics for the block encoded data. In accordance with an aspect of this invention the step of determining path metrics includes a step of retaining path metrics only for a Maximum Likely (ML) path and for a second best Likely path.

The method further includes a step of: (c) decoding the block encoded data by performing a partial traceback operation for both the ML path metrics and also for the second best path metrics. The partial traceback operation obtains from the ML path a first plurality of detected bits representing the data field; a second plurality of detected bits from the ML path representing the syndrome data field; a third plurality of detected bits from the first plurality of detected bits of length equal to the number of bits in the frame less the traceback length (e.g., 192−54=138 bits) concatenated with data field bits from the second best path of length equal to the traceback length less the syndrome bits plus any tail bits (e.g., 54−(12+8)=34 bits; and a fourth plurality of bits from the second best path representing the syndrome data field.

A next step (d) determines a syndrome from the first plurality of detected bits, and then compares the determined syndrome to the second plurality of detected bits. Upon a match a next step (e) outputs the first plurality of detected bits as a received frame of data.

If the step of comparing the determined syndrome to the second plurality of detected bits does not indicate a match, the method instead executes the steps of: (f) determining a syndrome from the third plurality of detected bits; (g) comparing the determined syndrome to the fourth plurality of detected bits and, upon a match, (h) outputting the third plurality of detected bits as a received frame of data.

An optional further step of either method uses the first or third plurality of detected bits to determine a bit error rate statistic for the received modulated communications signal.

In a presently preferred embodiment of this invention the received modulated communications signal is a convolutionally encoded, phase modulated, direct spread, code division multiple access communications signal, and the syndrome data field corresponds to a CRC data field.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
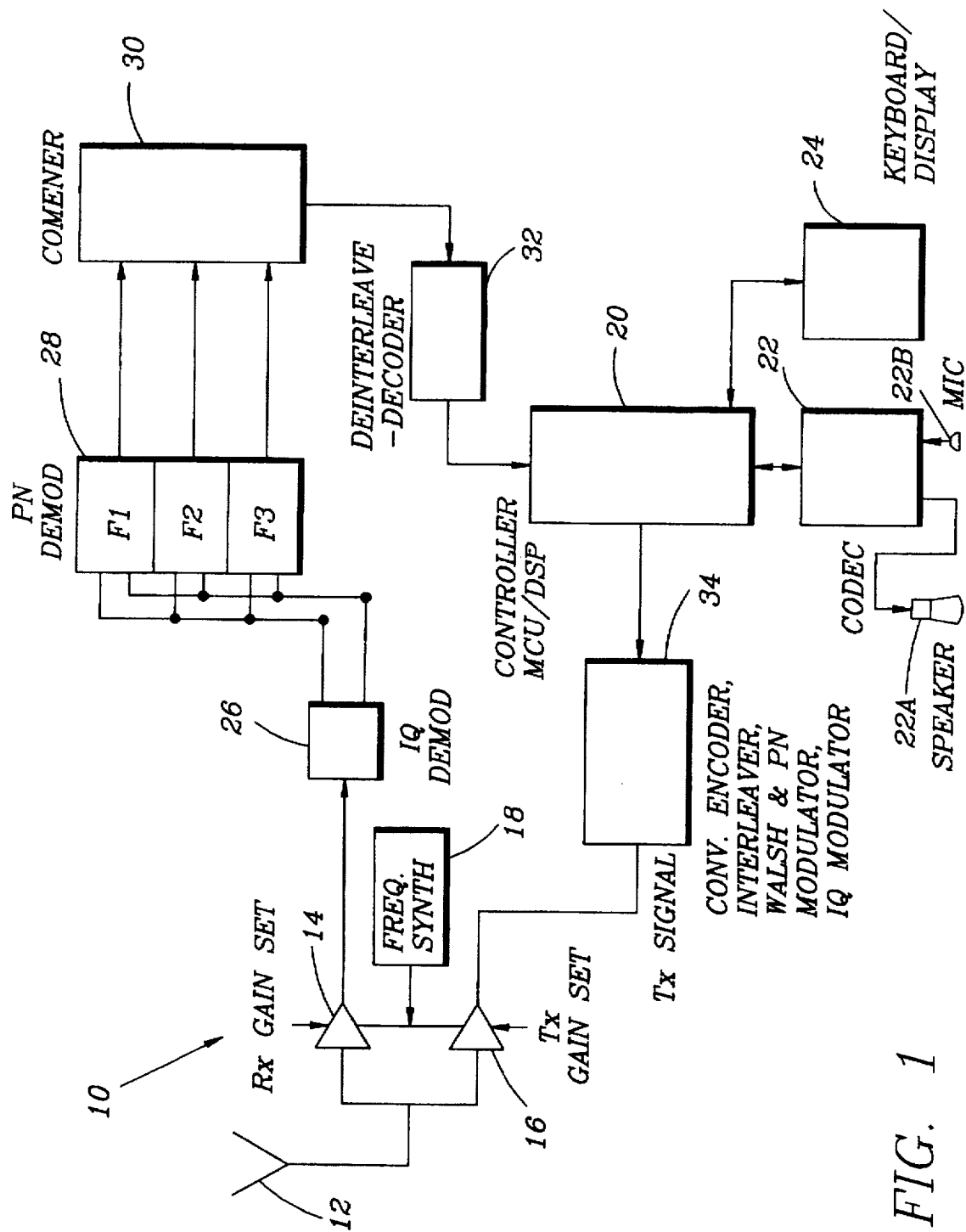
FIG. 1 is a block diagram of a radiotelephone that is constructed and operated in accordance with this invention.

Referring to FIG. 1 there is illustrated a presently preferred embodiment of a spread spectrum radiotelephone 10 that operates in accordance with a Viterbi decoder in accordance with this invention. As will become apparent, certain ones of the blocks of the radiotelephone 10 may be implemented with discrete circuit elements, or as software routines that are executed by a suitable digital data processor, such as a high speed signal processor. Alternatively, a combination of circuit elements and software routines can be employed. As such, the ensuing description is not intended to limit the application of this invention to any one particular technical embodiment.

In the preferred embodiment of this invention the spread spectrum radiotelephone 10 operates in accordance with the TIA/EIA Interim Standard, Mobile Station-Base Station Compatibility Standard for Dual-Mode Wideband Spread Spectrum Cellular System, TIA/EIA/IS-95 (July 1993). However, compatibility with this particular interim standard is not to be considered a limitation upon the practice of this invention.

The radiotelephone 10 includes an antenna 12 for receiving RF signals from a cell site, hereafter referred to as a base station (not shown), and for transmitting RF signals to the base station. When operating in the digital (spread spectrum or CDMA) mode the RF signals are phase modulated to convey speech and signalling information. Coupled to the antenna 12 are a gain controlled receiver 14 and a gain controlled transmitter 16 for receiving and for transmitting, respectively, the phase modulated RF signals. A frequency synthesizer 18 provides the required frequencies to the receiver and transmitter under the control of a controller 20. The controller 20 is comprised of a slower speed MCU for interfacing, via a codec 22, to a speaker 22a and a microphone 22b, and also to a keyboard and a display 24. In general, the MCU is responsible for the overall control and operation of the radiotelephone 10. The controller 20 is also preferably comprised of a higher speed digital signal processor (DSP) suitable for real-time processing of received and transmitted signals.

The received RF signals are converted to baseband in the receiver and are applied to a phase demodulator 26 which derives in-phase (I) and quadrature (Q) signals from the received signal. The I and Q signals are converted to digital representations by suitable A/D converters and applied to a multiple finger (e.g., three fingers F1–F3) demodulator 30, each of which includes a local PN generator. The output of the demodulator 28 is applied to a combiner 30 which outputs a signal, via a deinterleaver and decoder 32, to the controller 20. The digital signal input to the controller 20 is expressive of speech samples or signalling information. The processing of the signal by the decoder 32 is of most concern to this invention, and is described in detail below.

An input to the transmitter 16 (vocoded speech and/or signalling information) is derived from the controller 20 via a convolutional encoder, interleaver, Walsh modulator, PN modulator, and I-Q modulator, which are shown collectively as the block 34.

Figure 2:
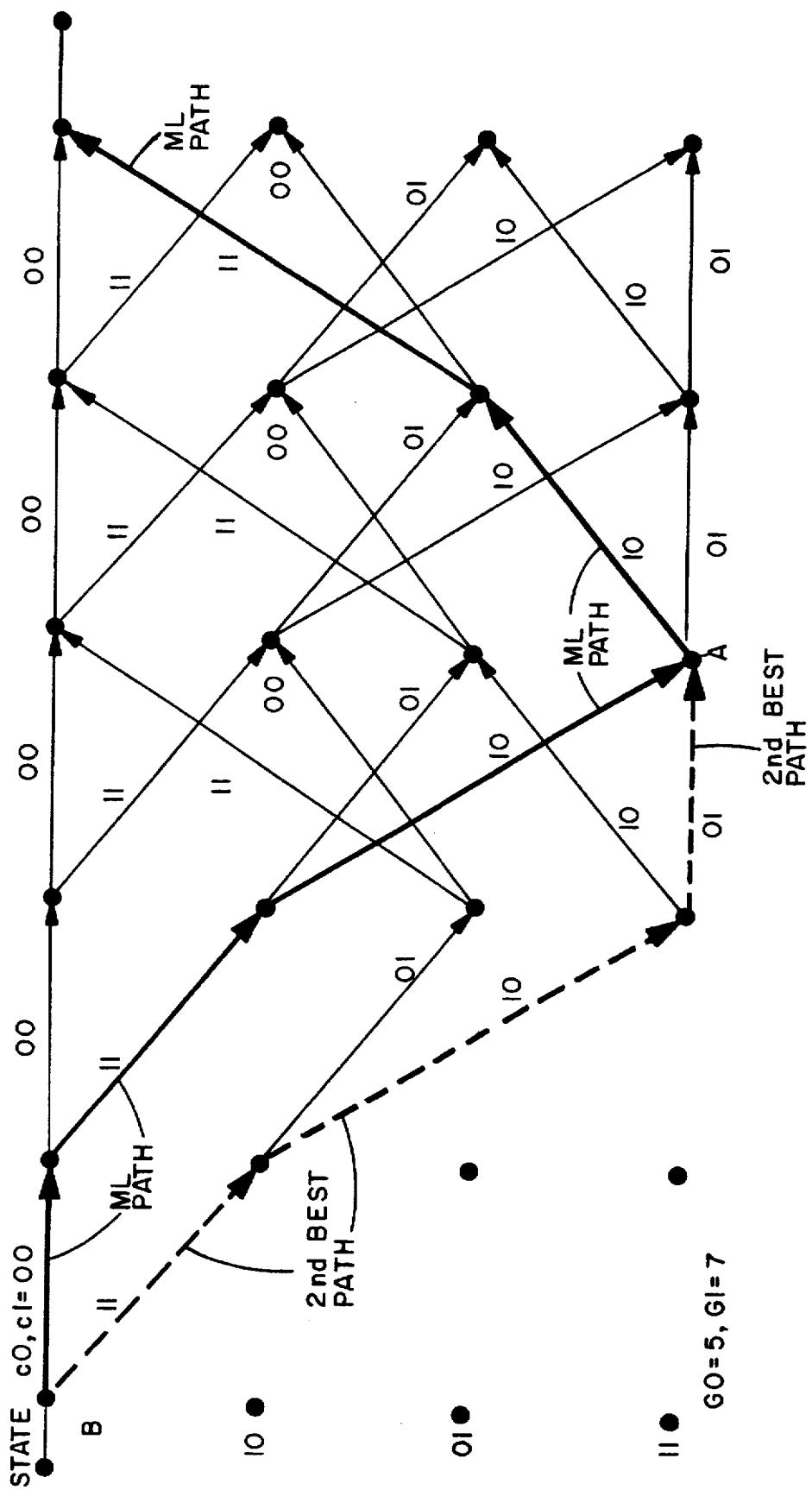
FIG. 2 illustrates a portion of a trellis and illustrates a Maximum Likely path and a second best Likely path that diverges from and then rejoins the Maximum Likely path.

FIG. 2 illustrates a portion of a simplified trellis and shows a Maximum Likely (ML) path and a second path, referred to herein as a second best Likely path, or simply as the second best path. In a presently preferred embodiment of this invention the trellis may be organized as 256 states by 192 transitions, for a vocoded speech frame comprised of 192 bits (172 bits of speech, 12 bits of appended CRC syndrome, and 8 bits of appended zeros, also referred to herein as tail bits).

It is known that after the second best path diverges from the ML path (indicated at the node A), that the second best path will rejoin with the ML path (indicated as the node B) and never diverge again. This is because the ML path will have the largest cumulative metric over the remainder of the trellis.

This invention exploits this property of the second best path, i.e., that the ML and the second best path are distinct over at least a portion of the trellis, by decoding the second best path after decoding the ML path as the decoder traverses through a Survivor Path Memory (SPM) that forms a portion of the decoder 32. By preserving only the ML path metrics and the second best path metrics in the SPM, the two best candidate sequences for decoding by the outer decoder (e.g. a CRC decoder) are preserved. The candidate sequence which passes through the outer decoder (CRC) without error is chosen as the best decoded sequence.

In practice, the ML path is decoded and if no errors are detected it is not necessary to decode the second best path. However, if an error is detected when decoding the ML path, the second best path metrics are retrieved from the SPM and are decoded. If no errors are found when decoding the second best path metric, the second best path sequence is selected to represent the output data sequence.

The technique of this invention may thus be considered as a novel variant of the List-Output Viterbi Algorithm (LOVA). The LOVA computes L best paths instead of only the ML path. The bit (or symbol) decisions along each path are hard, but the path selection by the outer processing stage is soft. However the complexity of the LOVA grows linearly with L. As such, a full L (1≦L≦Lmax) implementation is impractical for most applications since the number of list elements increases until a sequence is found which satisfies the outer code (e.g., a CRC). As such, this invention employs a novel variant of the LOVA wherein L=2.

Figure 3:
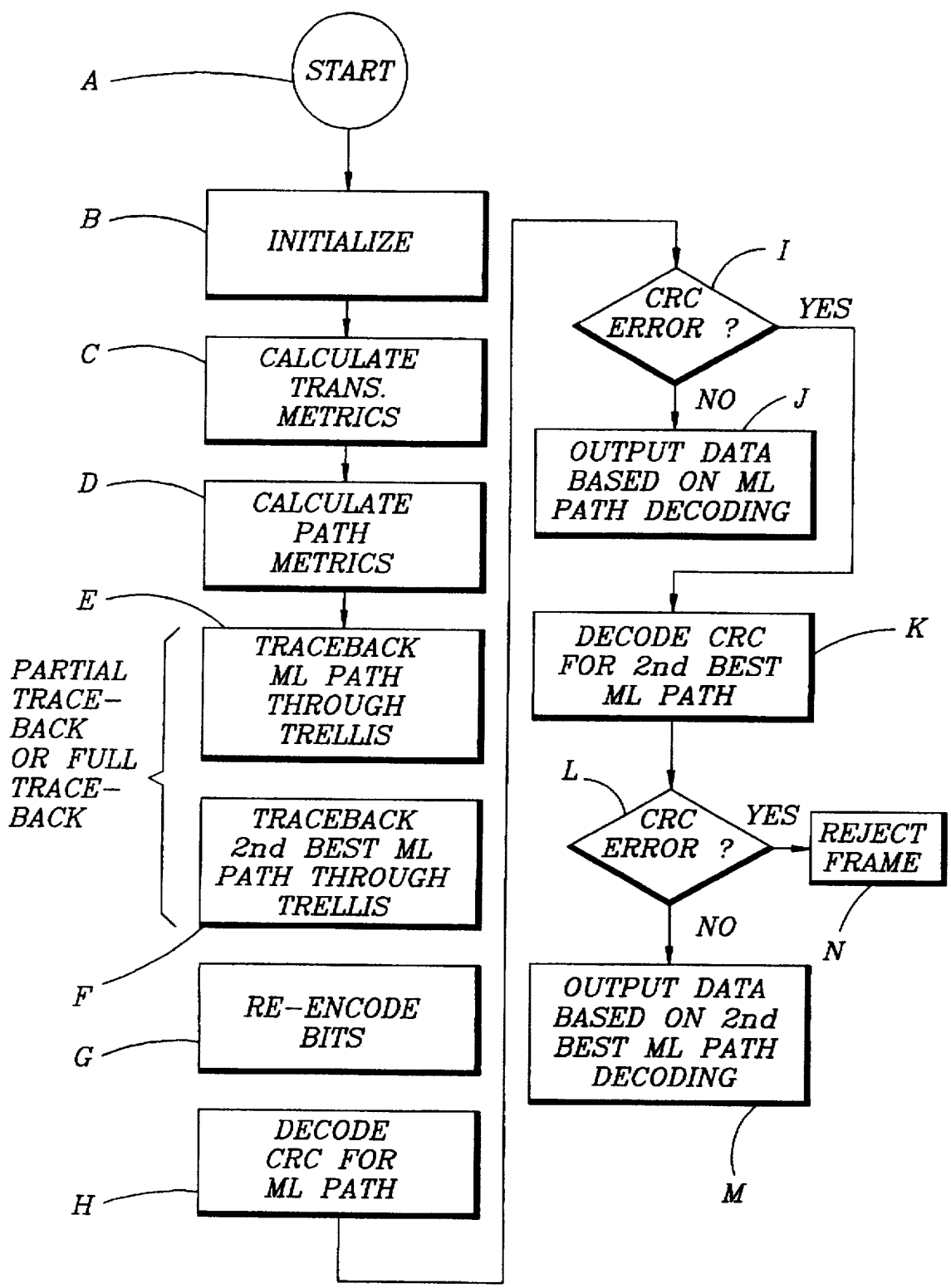
FIG. 3 is a logic flow diagram in accordance with this invention.
Figure 4:
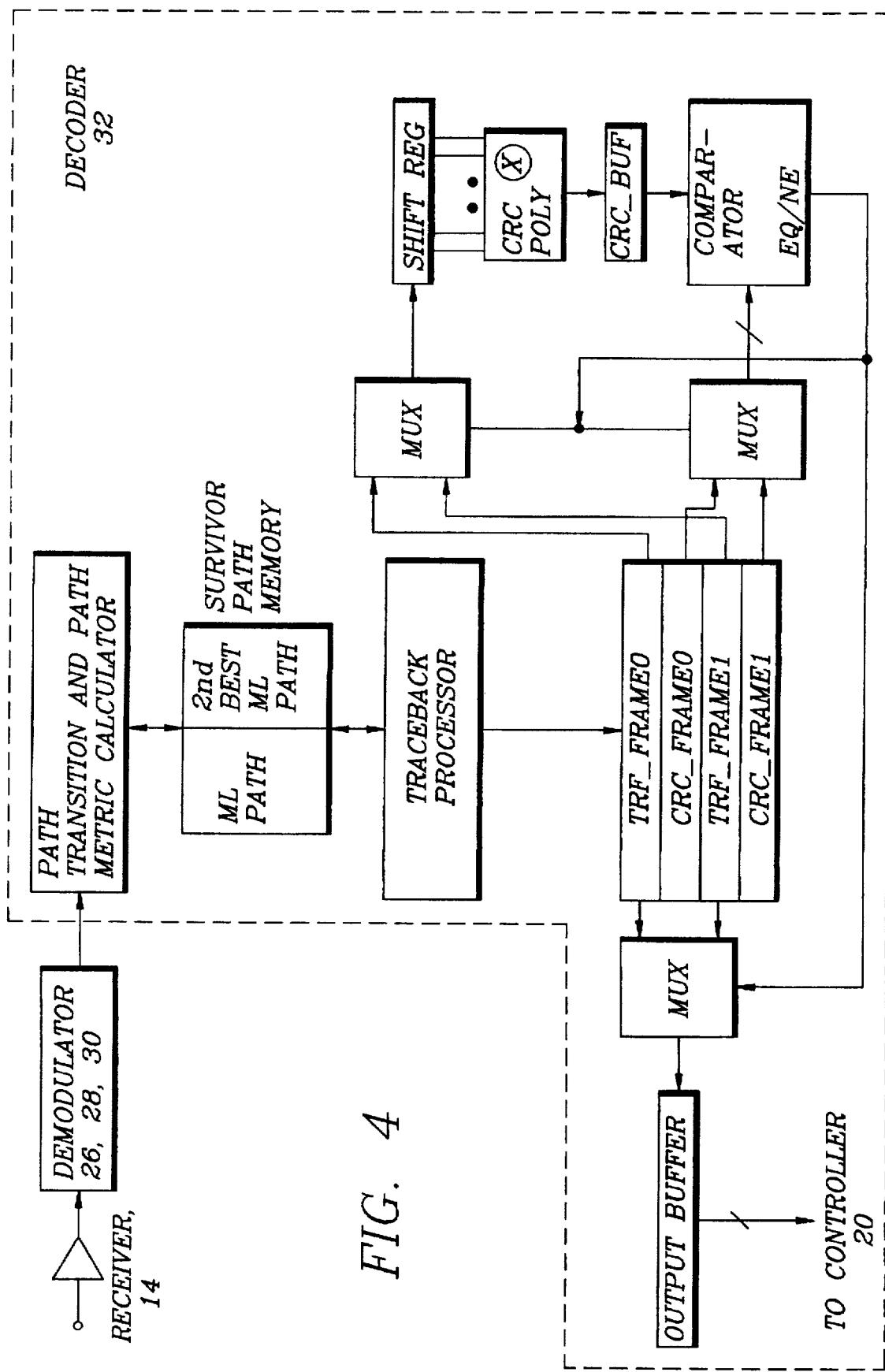
FIG. 4 is a simplified block diagram of the decoder of FIG. 1.
Figure 5:
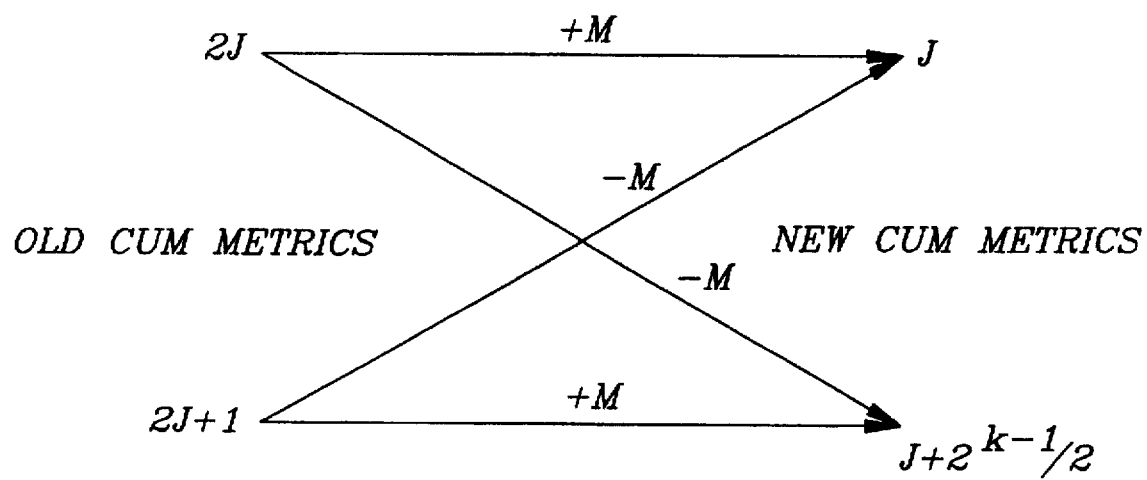
FIG. 5 is a diagram that illustrates a presently preferred path (or state) metrics calculation.

Reference is now made to FIG. 3 for illustrating a logic flow diagram of a presently preferred method of this invention for performing either a full or a partial traceback. FIG. 4 illustrates a simplified block diagram of the decoder 32, respectively, which can be used to implement either the full traceback or the partial traceback methods.

In particular, FIG. 3 illustrates the operation of the decoder 32 of FIG. 4 when decoding an input block of received data, such as a frame of vocoded speech.

In FIG. 3 the decoder begins at block A and transitions to block B where the decoder 32 is initialized by resetting a plurality of cumulative total entries to a predetermined value. The first entry (state 0) is set to zero, while the remaining 255 entries are set to some maximum negative number.

At block C the decoder 32 calculates transition branch metrics. That is, a measure of the Euclidean signal space difference between received symbols (where two symbols encode one bit) is thus obtained for the 192 possible transitions in the trellis, which correspond to the 192 bits in the received frame (i.e., 172 data bits, 12 syndrome (CRC) bits, and 8 tail bits).

At block D the decoder 32 calculates the path metrics. During the operation of block D the decoder 32 examines the transition path metrics obtained in block C by evaluating the transition probability of the encoder (i.e., the probability of the transition between the various allowed states (0 to 0, 0 to 1, 1 to 0, and 1 to 1)), and stores decision bits (1 or 0) into the Survivor Path Memory that forms a portion of the decoder 32. The decoder 32 then updates the associated cumulative total entries appropriately.

Further with regard to blocks C and D, Viterbi decoding is comprised fundamentally of three processes. A first step in the decoding process is the generation of a set of correlation measurements, known as branch metrics, for each code word (encoded bit) input from the communication channel. These branch metric values indicate the correlation (or confidence) between the received code word and $2^m$ possible code work combinations. By example, for code rate ½ m is two, and there will be four branch metrics.

The branch metric is defined as the square of the difference between the received sample value and an optimum value. There are four branch metrics to compute, two for each state. The squared term may be eliminated by adding and subtracting the received symbols s0 and s1 as follows: $+M=i+j$, $-M=i-j$. Since the first and last term of the generation polynomial are 1, the hypothesis (ij) for the transmitted symbols of the two paths entering and leaving a state are complements. The proper branch metric for each state transition is selected according to a current state.

In the second step of the decoding process, the Viterbi decoder determines the state of the encoder memory using a Maximum Likelihood technique. Once the state of the encoder memory is known, the original information is known, since the content of the encoder memory is simply the past history of the transmitted bits. In the process the Viterbi algorithm generates a set of state metrics which are measurements of the occurrence probability for each of the possible encoder memory states.

For a given code constraint length k, there will be $2^{k-1}$ possible data bit patterns (states), which are evaluated to determine a part of the most likely global path. For each state, the relative probability of the path following through this state is calculated by adding the branch metric for this transition to the cumulative (accumulated) state metric of each of the two possible states. The largest metric (in some implementations it is the smallest) is selected, and the new accumulated (cumulative) transition value for this state is stored into the cumulative metrics. Or in different words, the selected transition becomes the new state metric. For the IS-95 system, the algorithm will precede through all transitions, 192 times for rate 1, 96 times for rate 2, etc. for Set 1 of data rates, and 288, 144, 72, and 36 for Set 2.

As the state metrics are computed, the binary decision (survivor bit) is formed for each of the $2^{k-1}$ possible states as the probable path taken to arrive at the particular state. These binary decisions are stored in a survivor Path Memory.

In step three the Viterbi decoder computes the output data by performing the trace back from the current state to some point in the finite past of the binary decisions stored in the survivor path memory. The effects caused by channel noise are mitigated as the paths within the trace back memory converge after some history. The greater the depth (or length) of the survivor path memory, the more likely it is that the final decoded information is error free. As a result, codes with the higher constraint length require a longer survivor path memory for best performance. In summary, the trace back process in the Viterbi decoder traces the history of the previous state to arrive at the most probable state of the encoder in the past.

The path (or state) metrics calculation is preferably performed according to the diagram shown in FIG. 6 or, in other words, according to the following pseudo-code:

```
1. NEW_MET(J)=MAX(OLD_MET(2J)+M, OLD_MET(2J+1)-M)
    if
    (MAX=OLD_MET(2J)+M)
    then SURV_PATH_MEM(J)=0
    else SURV_PATH_MEM(J)=1
2. NEW_MET(J+2^(k-1))=MAX(OLD_MET(2J)-M,
    OLD_MET(2J+1)+M)
    if
    (MAX=OLD_MET(2J)-M)
    then SURV_PATH_MEM(J+2^(k-1))=0
    else SURV_PATH_MEM(J+2^(k-1))=1
```

During the calculation of the path metrics in block D, and in accordance with an aspect of this invention, after each transition is processed the most recently determined ML path metrics are compared with the previous ML path metrics. The larger of the two is designated as the ML path while the second largest is designated as the second best path. As a result, there are but two lists of path metrics that are preserved (i.e., L=2). However, only the ML list is stored into survivor path memory, while the second best is restored from the 2nd best metrics. At blocks E and F, and for a first embodiment of the invention, the decoder performs a full trace back through the trellis. That is, this embodiment of the invention assumes that the full surviving sequence can be stored and processed in real-time. If this is not the case, then the partial traceback method that is described below is preferred for use.

The result of the full trace back is the loading of a first 172-bit traffic frame buffer (TRF_FRAME0) with the detected bits of the 172-bit traffic frame in accordance with the ML path, the loading of a second 172-bit traffic frame buffer (TRF_FRAME1) with the detected bits of the 172-bit traffic frame in accordance with the second best path, the loading of a first 12-bit CRC buffer (CRC_FRAME0) with the 12 detected CRC bits from the traffic frame in accordance with the ML path, and the loading of a second 12-bit CRC buffer (CRC_FRAME1) with the 12 detected CRC bits from the traffic frame in accordance with the second best path.

Reference is again made to FIG. 2 wherein the trace back through the ML path and through the diverged second best path is illustrated with the arrows shown as solid (ML path) and dashed (second best path).

Referring again to FIG. 3, at block G an optional step is performed where the TRF_FRAME0 bits are re-encoded by multiplying by the encoder generator polynomial, and are then further processed so as to obtain symbol error rate (SER) statistics on the input to the decoder 32. The selected "good" TRF_FRAME0 or TRF_FRAME1 bits are used to provide the SER statistic.

At block H the TRF_FRAME0 bits (corresponding to the ML path) are multiplied by the appropriate CRC generator polynomial (selected in accordance with the current vocoder rate (e.g., 9600 baud)) and the 12-bit syndrome is stored in a CRC buffer (CRC_BUF). The calculated syndrome (CRC_BUF) is then compared at block I to the content of the CRC_FRAME0 buffer that was loaded from the 12-bit detected CRC field during the traceback step E. If the two are equal the detected bits of the traceback of the ML path are assumed to be correct, are loaded into an output buffer, and are thereafter made available to the controller 20 at block J. For example, a received frame of vocoded speech is then passed to the controller 20 to be converted to an analog speech signal.

If an error is detected at block I, control passes to block K where the TRF_FRAME1 bits (corresponding to the second best path) are multiplied by the appropriate CRC generator polynomial and the 12-bit syndrome is stored in the CRC buffer (CRC_BUF). The calculated syndrome (CRC_BUF) is then compared at block L to the content of the CRC_FRAME1 buffer that was loaded from the 12 bit detected CRC field during the partial traceback step F. If the two are equal the detected bits of the traceback of the second best path are assumed to be correct, are loaded into the output buffer, and are thereafter made available to the controller 20 at block M.

If an error is found at block L the frame can be rejected at block N, or accepted so long as the number of errors are below some predetermined (SER) error rate threshold (e.g. 1 percent), or above some predetermined value of the cumulative metric.

For a second embodiment of this invention, and referring again to blocks E and F of FIG. 3, the decoder performs a partial trace back through the trellis. A partial trace back is performed in this embodiment of the invention because of the large constraint length (i.e., the large channel memory) that is involved. With a large channel memory it is typically not practical to store the full surviving bit sequence.

In operation, the partial traceback is achieved by beginning at trellis transition x, where x is the trace back length (TB_Length or survivor path length which may be, by example, 54 bits), and tracing back to transition 0. A next traceback begins at x+1 and traces back to transition 1; a next traceback begins at x+2 and traces back to transition 2, etc.

The partial traceback operation obtains from the ML path a first plurality of detected bits representing the data field; a second plurality of detected bits from the ML path representing the syndrome data field; a third plurality of detected bits from the first plurality of detected bits of length equal to the number of bits in the frame less the TB_Length (e.g., 192−54=138 bits) that is concatenated with data field bits from the second best path of length equal to TB_Length less the syndrome bits plus any tail bits (e.g., 54−(12+8)=34 bits; and a fourth plurality of bits from the second best path representing the syndrome data field.

The remaining steps G–M are executed as described above for the full traceback embodiment.

The teaching of this invention has been found to provide a significant improvement in the operation of the Viterbi algorithm (e.g., as much as 0.2 dB), and does so without incurring any significant cost and complexity. By example, the additional buffers (TRF_FRAME1 and CRC_FRAME1) can be existing buffers that are not used during decoding (e.g., a buffer used during rate determination). The increased processing load due to the second traceback of the second best path has been found to be less than 1% over a conventional single traceback embodiment.

Although described in the context of a phase modulated SS-CDMA communications system, it should be realized that the teaching of this invention has wider applicability and can be used in, by example, TDMA systems, hybrid CDMA/TDMA systems, and systems using, by example, frequency or amplitude modulation.

It should further be realized that the teaching of this invention is also applicable to a continuous encoded channel, such as a paging channel, and is not limited for use with a block coded channel.

Thus, while the invention has been particularly shown and described with respect to preferred embodiments thereof, it will be understood by those skilled in the art that changes in form and details may be made therein without departing from the scope and spirit of the invention.

What is claimed is:

1. A method for decoding data received from a communications channel, comprising the steps of:

receiving a modulated communications signal that conveys encoded data having at least a data field and a syndrome data field;

determining transition metrics and path metrics for the encoded data, the step of determining path metrics including a step of retaining path metrics only for a Maximum-Likelihood (ML) path and a second best ML path;

decoding the encoded data by performing a traceback operation for both the ML path metrics and also for the second best ML path metrics to obtain from the ML path a first plurality of detected bits representing the data field, a second plurality of detected bits from the ML path representing the syndrome data field, a third plurality of detected bits from the second best ML path representing the data field, and a fourth plurality of detected bits from the second best ML path representing the syndrome data field;

determining a syndrome from the first plurality of detected bits;

comparing the determined syndrome to the second plurality of detected bits and, upon a match, outputting the first plurality of detected bits as a received frame of data;

else, if the step of comparing the determined syndrome to the second plurality of detected bits does not indicate a match;

determining a syndrome from the third plurality of detected bits;

comparing the determined syndrome to the fourth plurality of detected bits and, upon a match, outputting the third plurality of detected bits as a received frame of data.

2. A method as set forth in claim 1 and further comprising a step of using the first plurality of detected bits to determine a symbol error rate statistic for the received modulated communications signal.

3. A method as set forth in claim 1 wherein the received modulated communications signal is a phase modulated, direct spread, code division multiple access communications signal.

4. A method as set forth in claim 1 wherein the syndrome corresponds to a CRC.

5. A method as set forth in claim 1 wherein the step of performing a traceback operation performs the operation as one of a full traceback operation and a partial traceback operation.

6. A method as set forth in claim 1 wherein the modulated communications signal conveys block encoded data.

7. A method as set forth in claim 1 wherein the modulated communications signal conveys continuous encoded data.

8. A radiotelephone adapted for decoding data received from a communications channel, comprising:

a receiver for receiving a modulated communications signal that conveys block encoded data having at least a data field and a syndrome data field;

a demodulator for demodulating the received communications signal, the demodulator having an output providing a digital data stream representing the block encoded data;

a decoder having an input coupled to said output of said demodulator for decoding the block encoded data, said decoder comprising, means for calculating transition metrics and path metrics for the block encoded data;

a memory for retaining path metrics only for a Maximum-Likelihood (ML) path and a second best ML path;

means for performing a traceback operation for both the retained ML path metrics and also for the second best ML path metrics and for storing in a first buffer a first plurality of bits detected from the ML path that represent the data field, for storing in a second buffer a second plurality of bits detected from the ML path that represent the syndrome data field, for storing in a third buffer a third plurality of bits detected from the second best ML path that represent the data field, and for storing in a fourth buffer a fourth plurality of bits detected from the second best ML path that represent the syndrome data field;

means for determining a syndrome from the first plurality of detected bits and for comparing the determined syndrome to the second plurality of detected bits and, upon a match, for outputting the first plurality of detected bits as a received frame of data;

said determining means being responsive to a condition wherein said comparing means does not indicate a match for determining a syndrome from the third plurality of detected bits and for comparing the determined syndrome to the fourth plurality of detected bits and, upon a match, outputting the third plurality of detected bits as a received frame of data.

9. A radiotelephone as set forth in claim 8 wherein the received modulated communications signal is a phase modulated, direct spread, code division multiple access communications signal.

10. A radiotelephone as set forth in claim 8 wherein the syndrome corresponds to a CRC.

11. A radiotelephone as set forth in claim 8 wherein said traceback means performs one of a partial traceback operation and a full traceback operation.

12. A method for operating a radiotelephone for decoding data received from a phase modulated, direct spread, code division multiple access communications channel, comprising the steps of:

receiving a modulated communications signal that conveys a frame of encoded data having at least a speech data field and a syndrome data field;

demodulating the received communications signal to generate digital data representing the encoded data;

determining transition metrics and path metrics for the encoded data, the step of determining path metrics including a step of retaining path metrics only for a Maximum-Likelihood (ML) path and a second best ML path;

decoding the encoded data by performing a partial traceback operation for both the ML path metrics and also for the second best ML path metrics to obtain from the ML path a first plurality of detected bits representing the speech data field, a second plurality of detected bits from the ML path representing the syndrome data field, a third plurality of detected bits from the first plurality of detected bits of length equal to a number of bits in the frame, less a traceback length, that is concatenated with data field bits from the second best path of length equal to the traceback length, less the syndrome bits plus any tail bits; and a fourth plurality of bits from the second best path representing the syndrome data field;

determining a syndrome from the first plurality of detected bits;

comparing the determined syndrome to the second plurality of detected bits and, upon a match, outputting the first plurality of detected bits as a received frame of speech data;

else, if the step of comparing the determined syndrome to the second plurality of detected bits does not indicate a match;

determining a second syndrome from the third plurality of detected bits;

comparing the second syndrome to the fourth plurality of detected bits and, upon a match, outputting the third plurality of detected bits as a received frame of speech data.

13. A method as set forth in claim 12 and further comprising a step of using at least the first plurality of detected bits to determine a symbol error rate statistic for the received modulated communications signal.

14. A method as set forth in claim 12 wherein the frame contains 192 bits, and wherein the partial traceback length is equal to 54 bits.

* * * * *